United States Patent
Liu

(10) Patent No.: US 11,094,650 B1
(45) Date of Patent: Aug. 17, 2021

(54) SEMICONDUCTOR ARRANGEMENT AND METHOD OF MAKING

(71) Applicant: TAIWAN SEMICONDUCTOR MANUFACTURING COMPANY LIMITED, Hsin-Chu (TW)

(72) Inventor: Chien-Hsuan Liu, Tainan (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 0 days.

(21) Appl. No.: 16/787,079

(22) Filed: Feb. 11, 2020

(51) Int. Cl.
| H01L 23/58 | (2006.01) |
| H01L 23/31 | (2006.01) |
| H01L 23/528 | (2006.01) |
| H01L 21/768 | (2006.01) |
| H01L 23/522 | (2006.01) |

(52) U.S. Cl.
CPC ...... H01L 23/585 (2013.01); H01L 21/76802 (2013.01); H01L 21/76877 (2013.01); H01L 23/3171 (2013.01); H01L 23/3192 (2013.01); H01L 23/5226 (2013.01); H01L 23/5283 (2013.01)

(58) Field of Classification Search
CPC .......... H01L 21/76802; H01L 23/5226; H01L 23/585; H01L 23/53295; H01L 23/535
See application file for complete search history.

(56) References Cited

U.S. PATENT DOCUMENTS

2015/0357293 A1* 12/2015 Tomita ................ H01L 23/5283 257/629

* cited by examiner

*Primary Examiner* — Changhyun Yi
(74) *Attorney, Agent, or Firm* — Cooper Legal Group, LLC

(57) ABSTRACT

A semiconductor arrangement is provided. The semiconductor arrangement includes a first portion and a vertically conductive structure. The first portion includes a first dielectric layer and a first guard ring in the first dielectric layer. The first guard ring includes, in the first dielectric layer, a first metal layer coupled to a first via. The first portion includes a vertical conductive structure passing through the first dielectric layer and proximate by the first guard ring.

20 Claims, 12 Drawing Sheets

SEMICONDUCTOR ARRANGEMENT AND METHOD OF MAKING

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
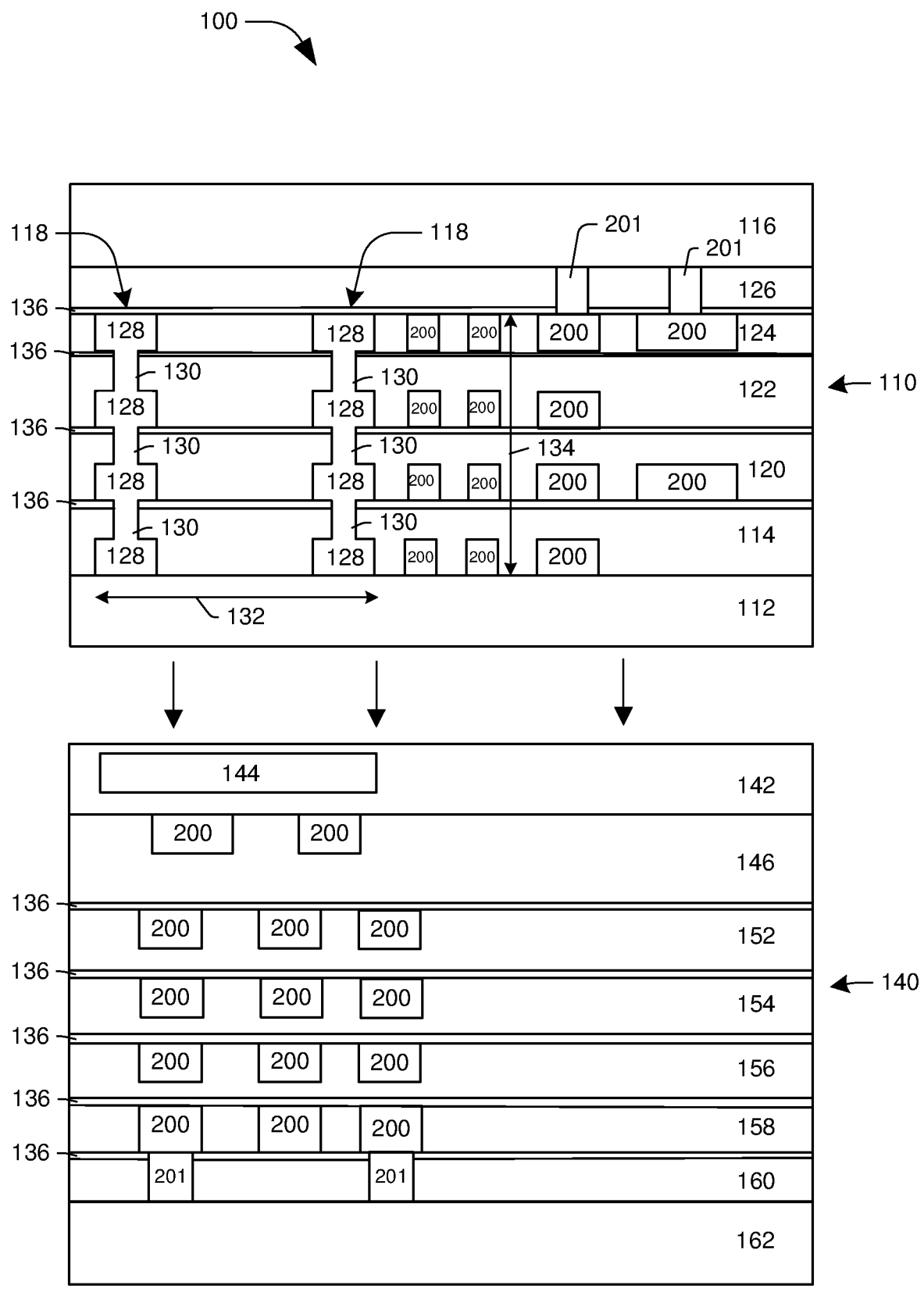
FIGS. 1-5 illustrate cross sectional views of a semiconductor arrangement at various stages of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Some embodiments relate to a semiconductor arrangement. In accordance with some embodiments, the semiconductor arrangement includes a first portion including a first passivation layer, a first dielectric layer over the first passivation layer, a first substrate over the first dielectric layer, a first conductive layer over the first substrate, and a first guard ring in the first dielectric layer. The semiconductor arrangement includes a second portion under the first portion. The second portion includes a second passivation layer and a second conductive layer in the second passivation layer. The semiconductor arrangement includes a vertical conductive structure passing through the first substrate, the first dielectric layer, and the first passivation layer. In some embodiments, the vertical conductive structure contacts the first conductive layer and the second conductive layer and is surrounded by the guard ring.

According to some embodiments, the first dielectric layer is an extra low-k (ELK) dielectric having a dielectric constant of about 2.6 or less. According to some embodiments, the guard ring protects, shields, electrically isolates, etc. at least one of the vertical conductive structure or the first dielectric layer. In some embodiments, the guard ring provides support, reinforcement, structural integrity, etc. for at least one of the vertical conductive structure or the first dielectric layer.

FIGS. 1-12 illustrate a semiconductor arrangement 100 at various stages of fabrication, in accordance with some embodiments.

Referring to FIG. 1, a semiconductor arrangement 100 includes a first portion 110 and a second portion 140, according to some embodiments. In some embodiments, the first portion 110 and the second portion 140 are fabricated separately and then placed together. In some embodiments, the first portion 110 is fabricated, inverted to the orientation illustrated in FIG. 1, and then placed on top of the second portion 140.

In some embodiments, the first portion 110 includes a first passivation layer 112, a first dielectric layer 114 over the first passivation layer 112, a second dielectric layer 120 over the first dielectric layer 114, a third dielectric layer 122 over the second dielectric layer 120, a fourth dielectric layer 124 over the third dielectric layer 122, a first interlayer dielectric (ILD) layer 126 over the fourth dielectric layer 124, and a first substrate 116 over the first ILD layer 126. A first guard ring 118 is in the first dielectric layer 114, the second dielectric layer 120, the third dielectric layer 122, and the fourth dielectric layer 124, according to some embodiments. In some embodiments, the first portion 110 includes more than four dielectric layers. In some embodiments, the first portion 110 includes fewer than four dielectric layers. In some embodiments, the first guard ring 118 is in all of the dielectric layers. In some embodiments, the first guard ring 118 is in fewer than all of the dielectric layers.

In some embodiments, the first passivation layer 112 includes at least one of AlN, $Al_2O_3$, $SiO_2$, or $Si_3N_4$, or other suitable materials. In some embodiments, the first passivation layer 112 includes a chemically inert, corrosion-resistant dielectric material. In some embodiments, the first passivation layer 112 includes an organic compound having at least one of an N-, P- or S-group molecular structure. In some embodiments, the first passivation layer 112 has a dielectric constant of about 4.2.

In some embodiments, the first passivation layer 112 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, a passivation process, or other suitable techniques. In some embodiments, a chemically-stable material is used to produce the first passivation layer 112. In some embodiments, the passivation process is a process in which a film covers an underlying material, such as the first dielectric layer 114 prior to the first portion 110 being inverted to the orientation illustrated in FIG. 1. In some embodiments, the film inhibits dissolution of the underlying material. In some embodiments, the film reduces chemical reactivity with regard to the underlying material. In some embodiments, the film reduces electrical reactivity with regard to the underlying material. In some embodiments, the passivation process includes at least one of oxidation of a surface of the underlying material or complexing of the surface with an organic compound. In some embodiments, the first passivation layer 112 inhibits diffusion of at least one of charges, atoms, or ions into the underlying material. In some embodiments, the first passivation layer 112 mitigates oxidation of the underlying material. In some embodiments, the first passivation layer 112 protects the underlying material from environmental conditions. In some embodiments, the first passivation layer 112 acts as a diffusion barrier with regard to the underlying material.

In some embodiments, at least one of the dielectric layers 114, 120, 122, or 124 includes at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, or other suitable materials. In some embodiments, at least one of the dielectric layers 114, 120, 122, or 124 electrically insulates inter connect lines in the first portion 110. In some embodiments, at least one of the dielectric layers 114, 120, 122, or 124 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, at least some of the dielectric layers are formed in a same manner. In some embodiments, at least some of the dielectric layers are formed in different manners.

According to some embodiments, at least one of the dielectric layers 114, 120, 122, or 124 is an ELK dielectric having a dielectric constant of about 2.6 or less. In some embodiments, at least one of the dielectric layers 114, 120, 122, or 124 has a dielectric constant less than a dielectric constant of the first passivation layer 112.

In some embodiments, the first ILD layer 126 includes at least one of tetraethylorthosilicate (TEOS), borophosphosilicate glass (BPSG), fused silica glass (FSG), phosphosilicate glass (PSG), boron doped silicon glass (BSG), polymeric thermoset material, or other suitable materials. In some embodiments, the first ILD layer 126 reduces capacitive coupling between adjacent conductive lines. In some embodiments, the first ILD layer 126 has a dielectric constant of about 4.2. In some embodiments, the first ILD layer 126 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

In some embodiments, the first substrate 116 includes at least one of an epitaxial layer, a silicon-on-insulator (SOI) structure, a wafer, or a die formed from a wafer. In some embodiments, the first substrate 116 includes silicon or other suitable materials.

According to some embodiments, the first guard ring 118 includes at least one of a metal layer 128 or a vertical interconnect access (VIA) 130. According to some embodiments, at least one of the metal layer 128 or the VIA 130 includes at least one of Al, Cu, Sn, Ni, Au, Ag, W, or other suitable material. In some embodiments, at least one of the metal layer 128 or the VIA 130 does not include metal. In some embodiments, at least one of the metal layer 128 or the VIA 130 is in at least one of the dielectric layers 114, 120, 122, or 124. According to some embodiments, the first guard ring 118 includes alternating layers of the metal layer 128 and the VIA 130. According to some embodiments, at least some of the metal layers 128 have a same width. In some embodiments, at least some of the metal layers 128 have different widths. In some embodiments, at least some of the metal layers 128 have a same height. In some embodiments, at least some of the metal layers 128 have different heights. In some embodiments, at least some of the metal layers 128 have different compositions as compared to other metal layers 128. In some embodiments, at least some of the VIAs 130 have a same width. In some embodiments, at least some of the VIAs 130 have different widths. In some embodiments, at least some of the VIAs 130 have a same height. In some embodiments, at least some of the VIAs 130 have different heights. In some embodiments, at least some of the VIAs 130 have different compositions as compared to other VIAs 130.

According to some embodiments, a width of at least some metal layers 128 is different than a width of at least some VIAs 130. In some embodiments, a width of at least some metal layers 128 is the same as a width of at least some VIAs 130. In some embodiments, a height of at least some metal layers 128 is different than a height of at least some VIAs 130. In some embodiments, a height of at least some metal layers 128 is the same as a height of at least some VIAs 130. In some embodiments, the first guard ring 118 has a width 132 of about 3 micrometers to about 6 micrometers. In some embodiments, the first guard ring 118 has a height 134 of about 0.5 micrometer to about 4 micrometers.

In some embodiments, at least one of the metal layer 128 or the VIA 130 is formed by at least one of lithography, etching, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In the lithography, a light sensitive material, such as a photoresist is formed over a layer to be patterned. Properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc. and the patterned photoresist is stripped or washed away at least one of before or after the pattern in the layer under the photoresist is filled with the one or more materials. In some embodiments, a dual damascene process is used to form at least one of a metal layer 128 or a VIA 130.

In some embodiments, a metal layer 128 and a VIA 130 are formed in the first dielectric layer 114, then the second dielectric layer 120 is formed and a metal layer 128 and a VIA 130 are formed in the second dielectric layer 120, then the third dielectric layer 122 is formed and a metal layer 128 and a VIA 130 are formed in the third dielectric layer 122, then the fourth dielectric layer 124 is formed and a metal layer 128 and a VIA 130 are formed in the fourth dielectric layer 124. In some embodiments, such a process is repeated any number of times to form the first guard ring 118. In some embodiments, the one or more dielectric layers do not include at least one of a metal layer 128 or a VIA 130. In some embodiments, the first guard ring 118 is discontinuous in that one or more intervening dielectric layers do not include at least one of a metal layer 128 or a VIA 130. In some embodiments, at least one of one or more of the metal layers 128 or one or more of the VIAs 130 are formed prior to at least some of a surrounding dielectric layer, such as at least one of at least some of the first dielectric layer 114, at least some of the second dielectric layer 120, at least some of the third dielectric layer 122, or at least some of the fourth dielectric layer 124. In some embodiments, at least some of a layer is formed and patterned to form at least one metal layer 128 and then at least some of the first dielectric layer 114 is formed around the at least one metal layer 128 such that the at least one metal layer 128 is in the first dielectric layer 114. In some embodiments, at least some of a layer is formed and patterned to form at least one VIA 130 and then at least some of the first dielectric layer 114 is formed around the at least one VIA 130 such that the at least one VIA 130 is in the first dielectric layer 114. In some embodiments, at least some of a layer is formed and patterned to form at least one metal layer 128 and then at least some of the second dielectric layer 120 is formed around the at least one metal layer 128 such that the at least one metal layer 128 is in the second dielectric layer 120. In some embodiments, at least some of a layer is formed and patterned to form at least one VIA 130 and then at least some of the second dielectric layer 120 is formed around the at least one VIA 130 such that the at least one VIA 130 is in the second dielectric layer 120. In some embodiments, at least some of a layer is formed and patterned to form at least one metal layer 128 and then at least some of the third dielectric layer 122 is formed around the at least one metal layer 128 such that the at least one metal layer 128 is in the third dielectric layer 122. In some embodiments, at least some of a layer is formed and patterned to form at least one VIA 130 and then at least some of the third dielectric layer 122 is formed around the at least one VIA 130 such that the at least one VIA 130 is in the third dielectric layer 122. In some embodiments, at least some of a layer is formed and patterned to form at least one metal layer 128 and then at least some of the fourth dielectric layer 124 is formed around the at least one metal layer 128 such that the at least one metal layer 128 is in the fourth dielectric layer 124.

In some embodiments, the first portion 110 includes at least one of one or more conductive elements 200 or one or more contacts 201. In some embodiments, at least some of the conductive elements 200 include at least one of Al, Cu, Sn, Ni, Au, Ag, W, or other suitable materials. In some embodiments, at least some of the conductive elements 200 have a same composition as at least one of at least some of the metal layers 128 or at least some of the VIAs 130. In some embodiments, at least some of the conductive elements 200 have a different composition than at least one of at least some of the metal layers 128 or at least some of the VIAs 130. In some embodiments, at least some of the conductive elements 200 have different compositions as compared to other conductive elements 200. In some embodiments, at least some of the contacts 201 include at least one of Al, Cu, Sn, Ni, Au, Ag, W, or other suitable materials. In some embodiments, at least some of the contacts 201 have a same composition as at least one of at least some of the metal layers 128, at least some of the VIAs 130, or at least some of the conductive elements 200. In some embodiments, at least some of the contacts 201 have a different composition than at least one of at least some of the metal layers 128, at least some of the VIAs 130, or at least some of the conductive elements 200. In some embodiments, at least some of the contacts 201 have different compositions as compared to other contacts 201. In some embodiments, at least one of the conductive element 200 or the contact 201 does not include metal. In some embodiments, at least some contacts 201 are in 0contact with at least some conductive elements 200. In some embodiments, a conductive element 200 serves as a routing line in the semiconductor arrangement 100 and a contact 201 that is in touch with the conductive element provides an electrically conductive pathway to the routing line.

According to some embodiments, any of the conductive elements 200 have any desired shape or size. According to some embodiments, any of the contacts 201 have any desired shape or size. In some embodiments, at least one of the conductive element 200 or the contact 201 is formed by at least one of lithography, etching, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, a conductive element 200 is formed in the first dielectric layer 114, then the second dielectric layer 120 is formed and a conductive element 200 is formed in the second dielectric layer 120, then the third dielectric layer 122 is formed and a conductive element 200 is formed in the third dielectric layer 122, then the fourth dielectric layer 124 is formed and a conductive element 200 is formed in the fourth dielectric layer 124. In some embodiments, such a process is repeated any number of times. In some embodiments, at least one of the dielectric layers do not include a conductive element 200. In some embodiments, the first ILD layer 126 is formed and a contact 201 is formed, such as by etching and deposition, in the first ILD layer 126. In some embodiments, at least one of one or more of the conductive elements 200 or one or more of the contacts 201 are formed prior to at least one of a surrounding layer, such as at least one of at least some of the first dielectric layer 114, at least some of the second dielectric layer 120, at least some of the third dielectric layer 122, at least some of the fourth dielectric layer 124, or at least some of the first ILD layer 126. In some embodiments, at least some of a layer is formed and patterned to form at least one conductive element 200 and then at least some of the first dielectric layer 114 is formed around the at least one conductive element 200 such that the at least one conductive element 200 is in the first dielectric layer 114. In some embodiments, at least some of a layer is formed and patterned to form at least one conductive element 200 and then at least some of the second dielectric layer 120 is formed around the at least one conductive element 200 such that the at least one conductive element 200 is in the second dielectric layer 120. In some embodiments, at least some of a layer is formed and patterned to form at least one conductive element 200 and then at least some of the third dielectric layer 122 is formed around the at least one conductive element 200 such that the at least one conductive element 200 is in the third dielectric layer 122. In some embodiments, at least some of a layer is formed and patterned to form at least one conductive element 200 and then at least some of the fourth dielectric layer 124 is formed around the at least one conductive element 200 such that the at least one conductive element 200 is in the fourth dielectric layer 124. In some embodiments, at least some of a layer is formed and patterned to form at least one contact 201 and then at least some of the first ILD layer 126 is formed around the at least one contact 201 such that the at least one contact 201 is in the first ILD layer 126.

In some embodiments, the first portion 110 includes one or more etch stop layers 136, such as between adjacent dielectric layers. In some embodiments, an etch stop layer has a different etch selectively relative to an overlying or adjacent layer such that when an etchant etches through the overlying layer the etching process slows or stops upon the etchant encountering the underlying etch stop layer. According to some embodiments, an etch stop layer comprises silicon, carbon, or other suitable materials. In some embodiments, at least some different etch stop layers have different compositions, such as due to the use of different etchants to etch different materials. In some embodiments, the etch stop layer 136 between the first ILD layer 126 and the fourth dielectric layer 124 has a different composition than at least one other etch stop layer 136, such as due to a different etchant used to etch the first ILD layer 126 as compared an etchant used to etch at least one of the fourth dielectric layer 124, the third dielectric layer 122, the second dielectric layer 120, or the first dielectric layer 114.

In some embodiments, the second portion 140 includes a second passivation layer 142, a conductive layer 144 in the second passivation layer 142, a transition metal dielectric (TMD) layer 146 under the second passivation layer 142, a first inter-metal dielectric (IMD) layer 152 under the TMD layer 146, a second IMD layer 154 under the first IMD layer 152, a third IMD layer 156 under the second IMD layer 154, a fourth IMD layer 158 under the third IMD layer 156, a second ILD layer 160 under the fourth IMD layer 158, and a second substrate 162 under the second ILD layer 160. In some embodiments, the second portion 140 includes more than four IMD layers. In some embodiments, the second portion 140 includes fewer than four IMD layers.

In some embodiments, the second passivation layer 142 includes at least one of AlN, $Al_2O_3$, $SiO_2$, or $Si_3N_4$, or other suitable materials. In some embodiments, the second passivation layer 142 includes a chemically inert, corrosion-resistant dielectric material. In some embodiments, the second passivation layer 142 includes an organic compound having at least one of an N-, P- or S-group molecular structure. In some embodiments, the second passivation layer 142 includes heteroatoms. In some embodiments, the second passivation layer 142 has a dielectric constant of about 4.2. In some embodiments, the second passivation layer 142 has a same composition as the first passivation layer 112. In some embodiments, the second passivation layer 142 has a different composition than the first passivation layer 112. In some embodiments, the second passivation layer 142 is formed by at least one of a passivation process, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, the second passivation layer 142 is formed in a same manner as the first passivation layer 112. In some embodiments, the second passivation layer 142 is formed in a different manner than the first passivation layer 112.

In some embodiments, the conductive layer 144 includes at least one of Al, Cu, Sn, Ni, Au, Ag, W, or other suitable materials. In some embodiments, the conductive layer 144 includes a binary alloy of aluminum and copper. In some embodiments, the conductive layer 144 is embedded in the second passivation layer 142 so as to be covered on all sides by the second passivation layer 142. In some embodiments, the conductive layer 144 is formed by at least one of lithography, etching, physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

In some embodiments, the TMD layer 146 includes at least one of Al, Cu, Sn, Ni, Au, Ag, W, or other suitable materials. In some embodiments, the TMD layer 146 includes an atomically thin layer of a transition metal and a chalcogen. In some embodiments, the transition metal includes at least one of Mo, W, or other suitable materials. In some embodiments, the chalcogen includes at least one of S, Si, Te, or other suitable materials. According to some embodiments, atoms of the transition metal are sandwiched between two layers of chalcogen atoms. In some embodiments, the TMD layer 146 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

According to some embodiments, at least one of the IMD layers 152, 154, 156, or 158 includes at least one of a polymer, an oxide, polybenzobisoxazole (PBO), a polyimide (PI), a metal nitride, silicon, germanium, carbide, gallium, arsenide, germanium, arsenic, indium, silicon oxide, sapphire, or other suitable materials. In some embodiments, at least one of the IMD layers 152, 154, 156, or 158 electrically insulate inter connect lines in the second portion 140. In some embodiments, at least one of the IMD layers 152, 154, 156, or 158 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin coating, oxidation, or other suitable techniques. In some embodiments, at least some of the IMD layers are formed in a same manner. In some embodiments, at least some of the IMD layers are formed in different manners.

According to some embodiments, at least one of the IMD layers 152, 154, 156, or 158 has a dielectric constant of about 3 or less. In some embodiments, at least one of the IMD layers 152, 154, 156, or 158 has a dielectric constant less than a dielectric constant of the second passivation layer 142.

In some embodiments, the second ILD layer 160 includes at least one of tetraethylorthosilicate (TEOS), borophosphosilicate glass (BPSG), fused silica glass (FSG), phosphosilicate glass (PSG), boron doped silicon glass (BSG), polymeric thermoset material, or other suitable materials. In some embodiments, the second ILD layer 160 reduces capacitive coupling between adjacent conductive lines. In some embodiments, the second ILD layer 160 has a dielectric constant of about 4.2. In some embodiments, the second ILD layer 160 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, the second ILD layer 160 is formed in a same manner as the first ILD layer 126. In some embodiments, the second ILD layer 160 is formed in a different manner than the first ILD layer 126.

In some embodiments, the second substrate 162 includes at least one of an epitaxial layer, a silicon-on-insulator (SOI) structure, a wafer, or a die formed from a wafer. In some embodiments, the second substrate 162 includes silicon or other suitable materials. In some embodiments, the second substrate 162 has a same composition as the first substrate 116. In some embodiments, the second substrate 162 has a different composition than the first substrate 116. In some embodiments, the second portion 140 includes at least one of one or more conductive elements 200, one or more contacts 201, or one or more etch stop layers 136. In some embodiments, at least some of the conductive elements 200 in the second portion 140 at least one of have a same composition, are formed in a same manner, perform a same function, etc. as at least some of the conductive elements 200 in the first portion 110. In some embodiments, at least some of the contacts 201 in the second portion 140 at least one of have a same composition, are formed in a same manner, perform a same function, etc. as at least some of the contacts 201 in the first portion 110. In some embodiments, at least some of the etch stop layers 136 in the second portion 140 at least one of have a same composition, are formed in a same manner, perform a same function, etc. as at least some of the etch stop layers 136 in the first portion 110.

Figure 2:
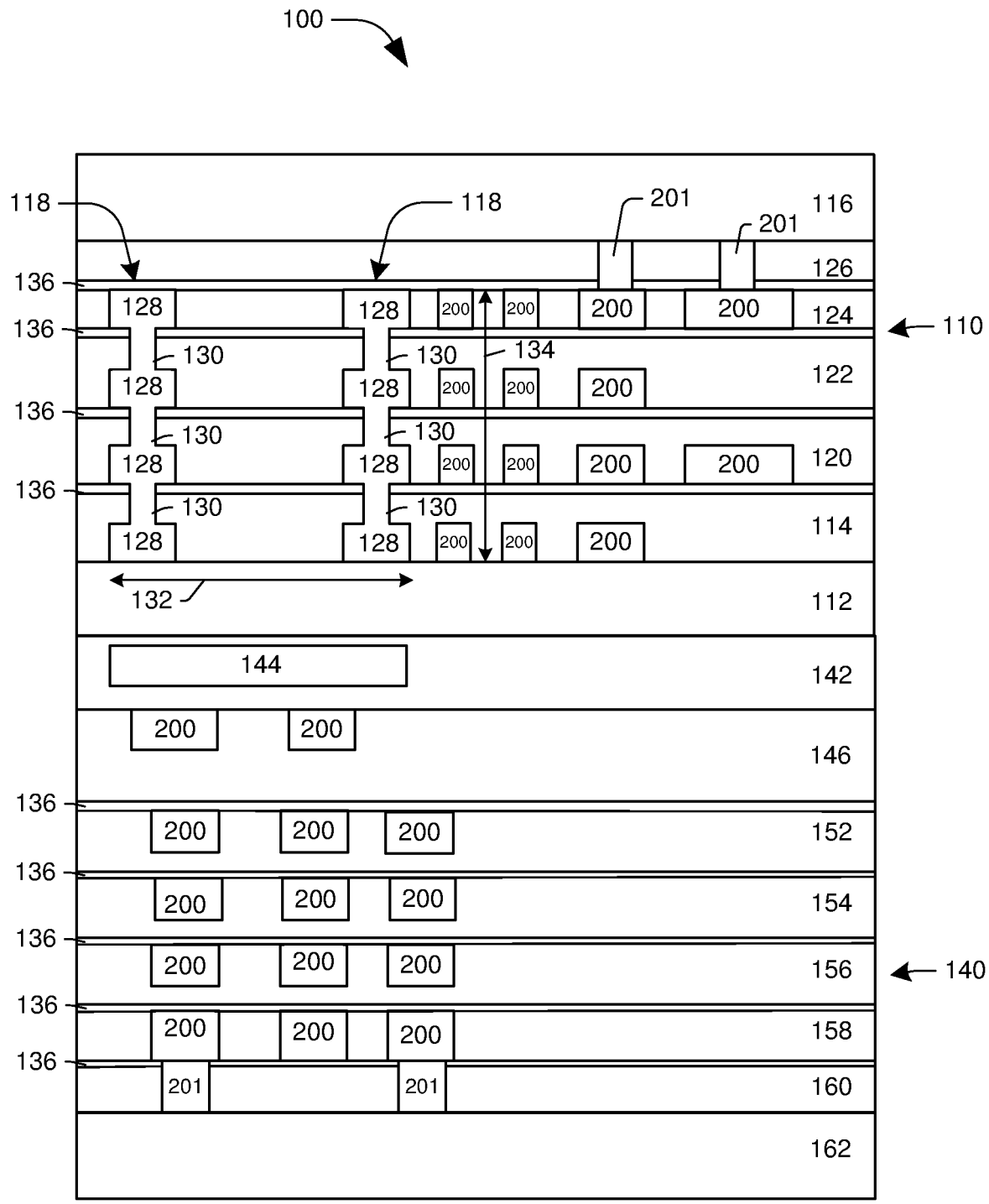

FIG. 2 illustrates the first portion 110 on the second portion 140, according to some embodiments. According to some embodiments, the first passivation layer 112 contacts the second passivation layer 142. According to some embodiments, the first passivation layer 112 is adhered to the second passivation layer 142. According to some embodiments, a delineation persists between the first passivation layer 112 and the second passivation layer 142 despite the first passivation layer 112 being at least one of in contact with or adhered to the second passivation layer 142.

Figure 3:
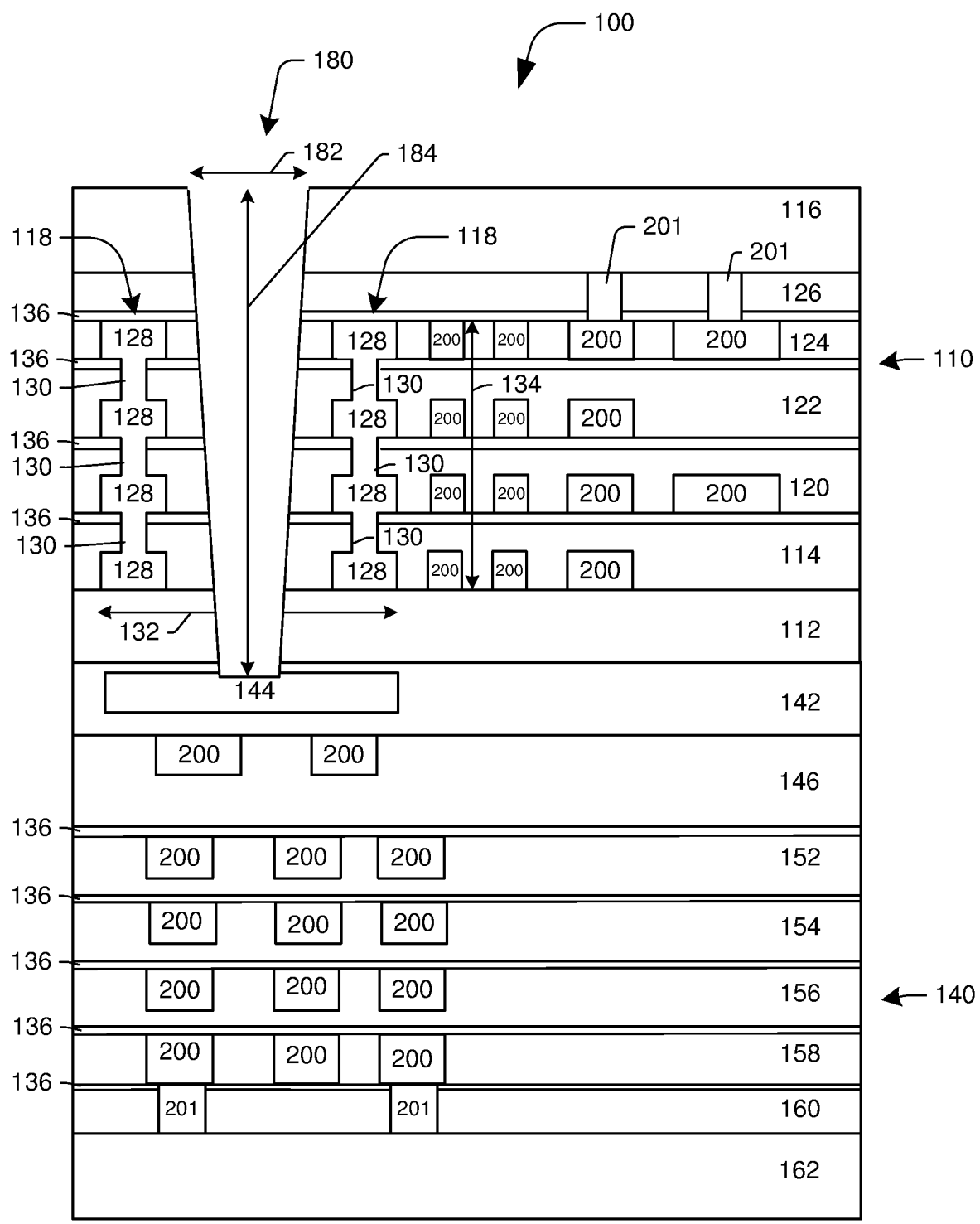

Referring to FIG. 3, an opening 180 is formed in the first portion 110 and the second portion 140. In some embodiments, the opening 180 is formed so that the opening 180 is surrounded by the first guard ring 118. In some embodiments, the opening 180 is formed from a top surface of the first substrate 116 and extends through the first substrate 116, the first ILD layer 126, the fourth dielectric layer 124, the third dielectric layer 122, the second dielectric layer 120, the first dielectric layer 114, the first passivation layer 112, and the second passivation layer 142. In some embodiments, the opening 180 exposes the conductive layer 144.

In some embodiments, the opening 180 is formed by at least one of lithography, etching, or other suitable techniques. According to some embodiments, an etchant has a selectivity such that the etchant removes or etches away the first substrate 116, the first ILD layer 126, the fourth dielectric layer 124, the third dielectric layer 122, the second dielectric layer 120, the first dielectric layer 114, the first passivation layer 112, and the second passivation layer 142 at a greater rate than the etchant removes or etches away an overlying patterned photoresist. According to some embodiments, the opening 180 is defined by sidewalls of the first substrate 116, the first ILD layer 126, the fourth dielectric layer 124, the third dielectric layer 122, the second dielectric layer 120, the first dielectric layer 114, the first passivation layer 112, and the second passivation layer 142. In some embodiments, the etchant removes or etches away an amount of at least one of the first substrate 116, the first ILD layer 126, the fourth dielectric layer 124, the third dielectric layer 122, the second dielectric layer 120, the first dielectric layer 114, the first passivation layer 112, or the second passivation layer 142 so as to expose at least some of at least one of a metal layer 128 or a VIA 130 and thus at least some of the opening 180 is defined by at least some of at least one of a metal layer 128 or a VIA 130.

In some embodiments, the opening 180 has a width 182 and a height 184. In some embodiments, the width 182 is about 0.5 micrometers to about 4 micrometers. In some embodiments, the height 184 is about 3 micrometers to about 8 micrometers. According to some embodiments, the opening 180 is defined by tapered sidewalls such that the width 182 varies along the height 184 of the opening 180. In some embodiments, the width 182 decreases moving in a direction from the first substrate 116 to the conductive layer 144. According to some embodiments, the opening has any cross sectional profile, such as stair stepped, hourglass, non-tapered, etc., such as from at least one of using one or more etchants or using one or more etching processes, such as directional etching, isotropic etching, anisotropic etching, etc.

Figure 4:
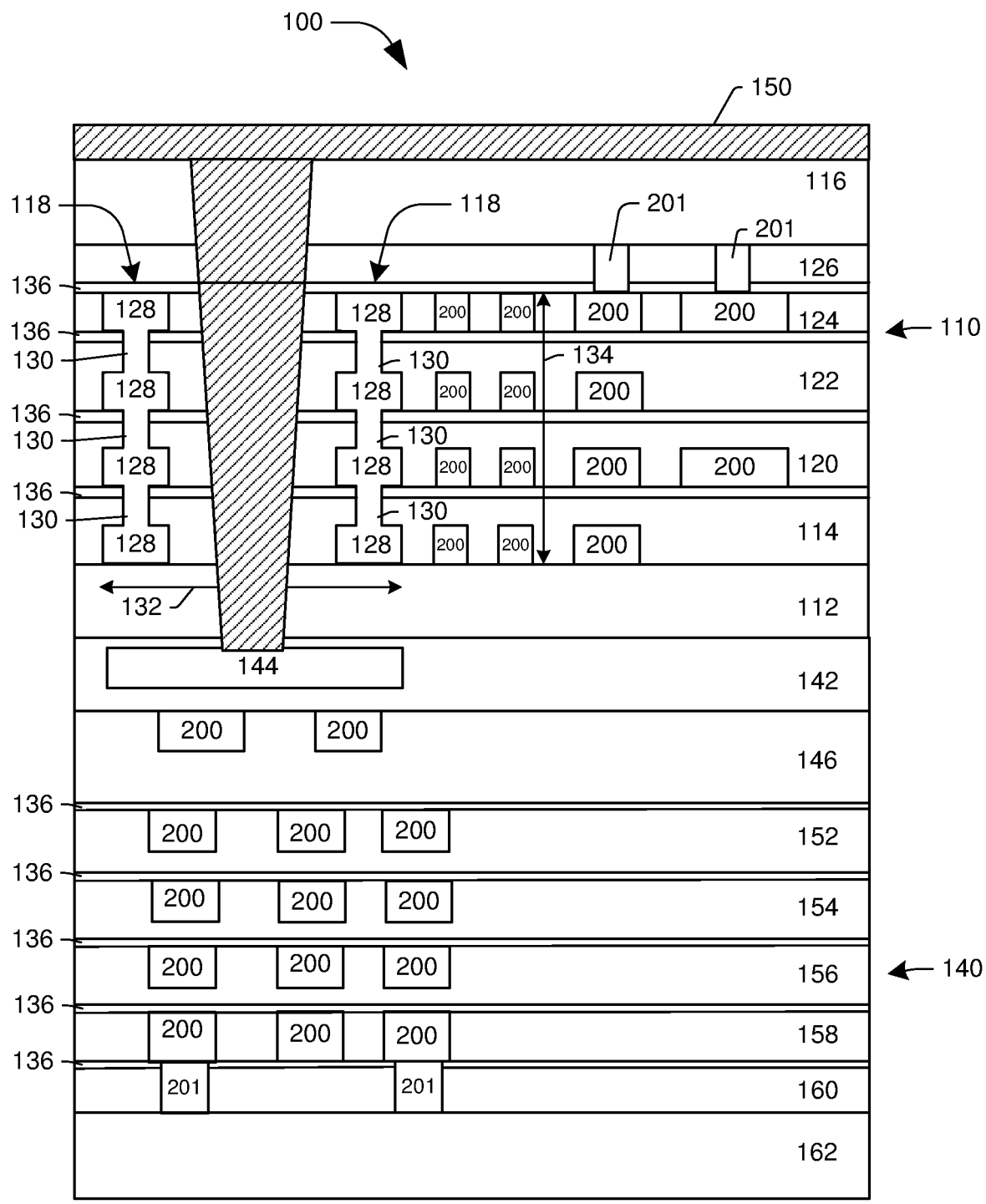

Referring to FIG. 4, a conductive material 150 is formed over the first substrate 116 and in the opening 180. In some embodiments, the conductive material 150 includes at least one of includes Al, Cu, Sn, Ni, Au, Ag, W, or other suitable materials. In some embodiments, the conductive material is formed by at least one of focused-ion beam (FIB), physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 5:
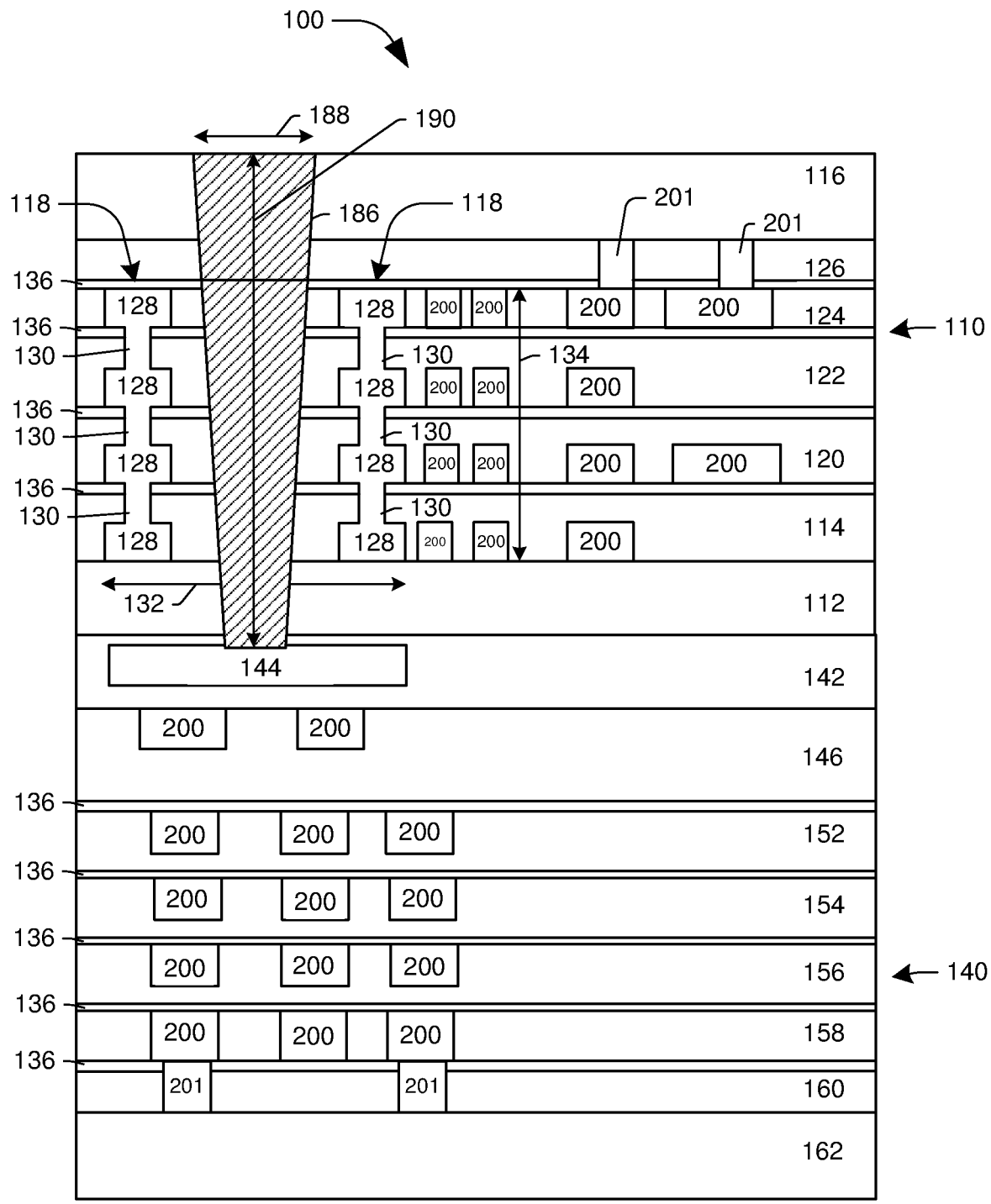

Referring to FIG. 5, excess conductive material is removed to establish a vertical conductive structure 186 in the opening 180. In some embodiments, removal of the excess material conductive exposes the top surface of the first substrate 116. In some embodiments, the vertical conductive structure 186 has a width 188 and a height 190. According to some embodiments, the width 188 of the vertical conductive structure 186 corresponds to the width 182 of the opening 180. According to some embodiments, the height 190 of the vertical conductive structure 186 corresponds to the height 184 of the opening 180. According to some embodiments, the vertical conductive structure 186 has any cross sectional profile. According to some embodiments, the vertical conductive structure 186 has a cross sectional profile that corresponds to the cross sectional profile of the opening. According to some embodiments, the width 188 varies along the height 190 of the vertical conductive structure 186. In some embodiments, the width 188 decreases moving in a direction from the first substrate 116 to the conductive layer 144. According to some embodiments, one or more sidewalls of the vertical conductive structure 186 are at least one of tapered, stair stepped, non-linear, non-tapered, etc. In some embodiments, the excess conductive material is removed by at least one of chemical mechanical polishing (CMP) or other suitable techniques. In some embodiments, an abrasive slurry is used in the removal of the excess material. In some embodiments, the vertical conductive structure 186 comprises a through-silicon VIA (TSV). In some embodiments, a TSV is a high-performance interconnect used as an alternative to wire-bond and flip chips. In some embodiments, the TSV is used in creating 3D packages. In some embodiments, the TSV is used to create 3D integrated circuits (ICs). In some embodiments, the TSV is used to shorten lengths of connections. In some embodiments, the vertical conductive structure 186 comprises a through-organic VIA (TOV).

According to some embodiments, a barrier layer (not shown) is formed over sidewalls, surfaces, etc. defining the opening 180 prior to the conductive material 150. According to some embodiments, the barrier layer is relatively thin and does not fill the opening 180, such that the conductive material 150 is formed over the barrier layer. According to some embodiments, the barrier layer includes at least one of titanium nitride, titanium oxynitride, tantalum nitride, tantalum oxynitride, tungsten nitride, or other suitable materials. In some embodiments, the barrier layer is formed by at least one of focused-ion beam (FIB), physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 6:
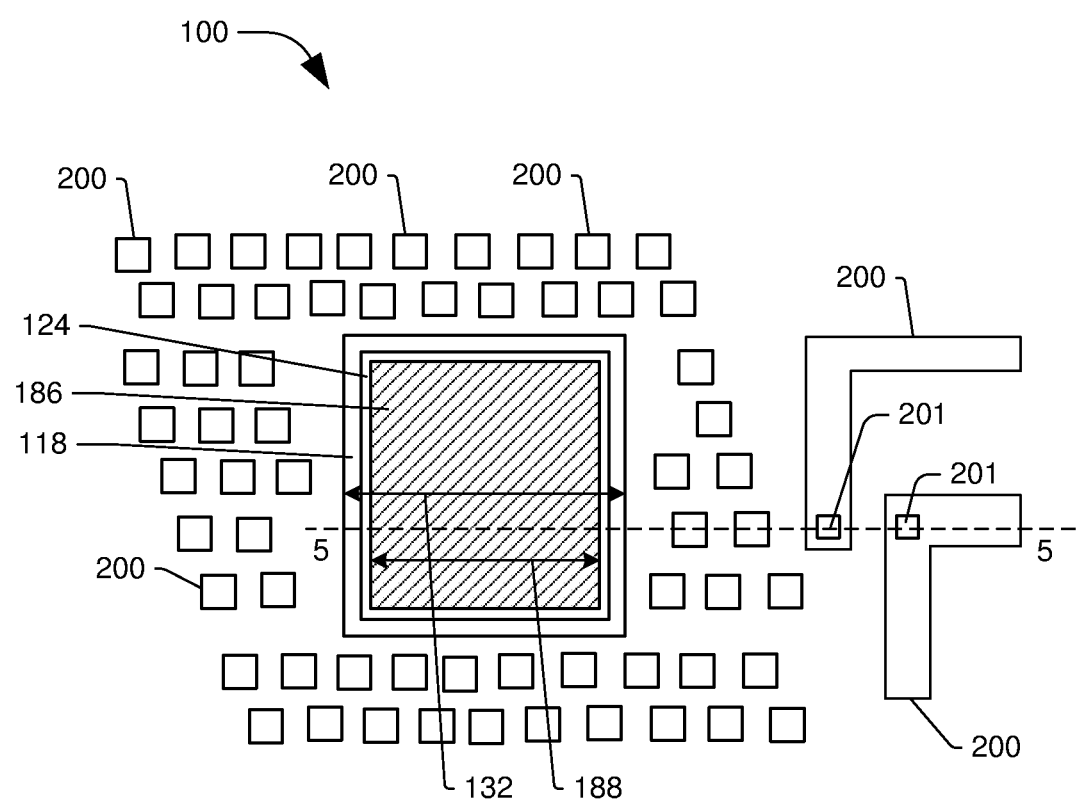
FIG. 6 illustrates a top-down view of a semiconductor arrangement during fabrication, in accordance with some embodiments.

FIG. 6 illustrates a top-down view of the semiconductor arrangement 100 of FIG. 5 when the first substrate 116, the first ILD layer 126, and the etch stop layer 136 are removed, according to some embodiments. According to some embodiments, FIG. 5 corresponds to a cross sectional view taken along line 5-5 in FIG. 6. In some embodiments, the plurality of conductive elements 200 exist around the first guard ring 118. In some embodiments, conductive elements 200 are used as wiring inside the semiconductor arrangement 100. According to some embodiments, the first guard ring 118 completely surrounds, encircles, etc. all sides or sidewalls of the vertical conductive structure 186. According to some embodiments, the first guard ring 118 is discontinuous or has a break so as to surround, encircle, etc. some but not all of the vertical conductive structure 186.

Although illustrated as generally quadrilateral, according to some embodiments a top profile of at least one of the vertical conductive structure 186 or the first guard ring 118 is any desired shape other than quadrilateral, such as at least one of elliptical, polygonal, star shaped, etc.

Figure 7:
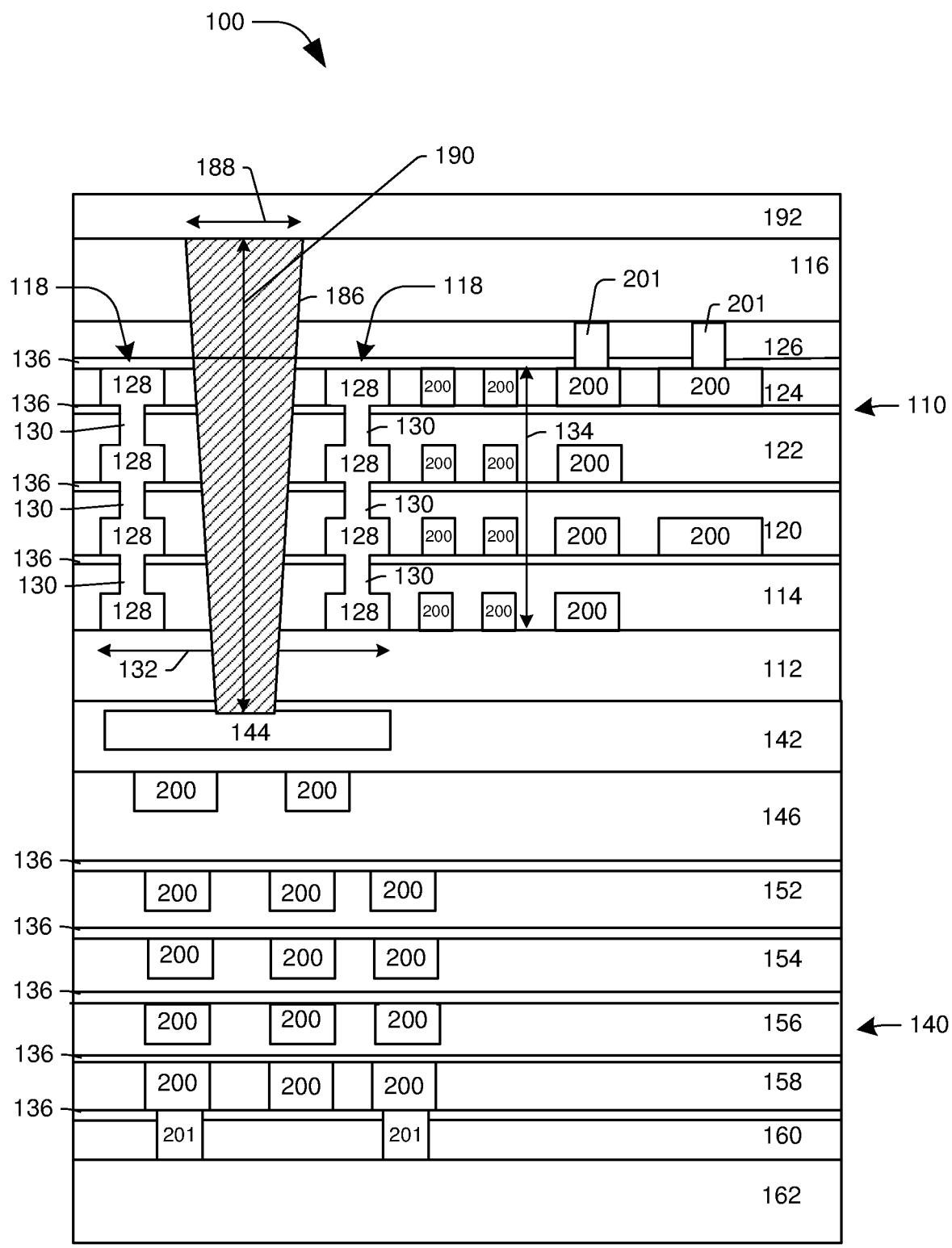
FIGS. 7-9 illustrate cross sectional views of a semiconductor arrangement at various stages of fabrication, in accordance with some embodiments.

Referring to FIG. 7, a conductive layer 192 is formed over the first substrate 116 and the vertical conductive structure 186. In some embodiments, the conductive layer 192 includes at least one of Al, Cu, Sn, Ni, Au, Ag, W, or other suitable materials. In some embodiments, the conductive layer 192 has a same composition as at least one of the conductive layer 144 or the vertical conductive structure 186. In some embodiments, the conductive layer 192 has a different composition than at least one of the conductive layer 144 or the vertical conductive structure 186. In some embodiments, the conductive layer 144 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

Figure 8:
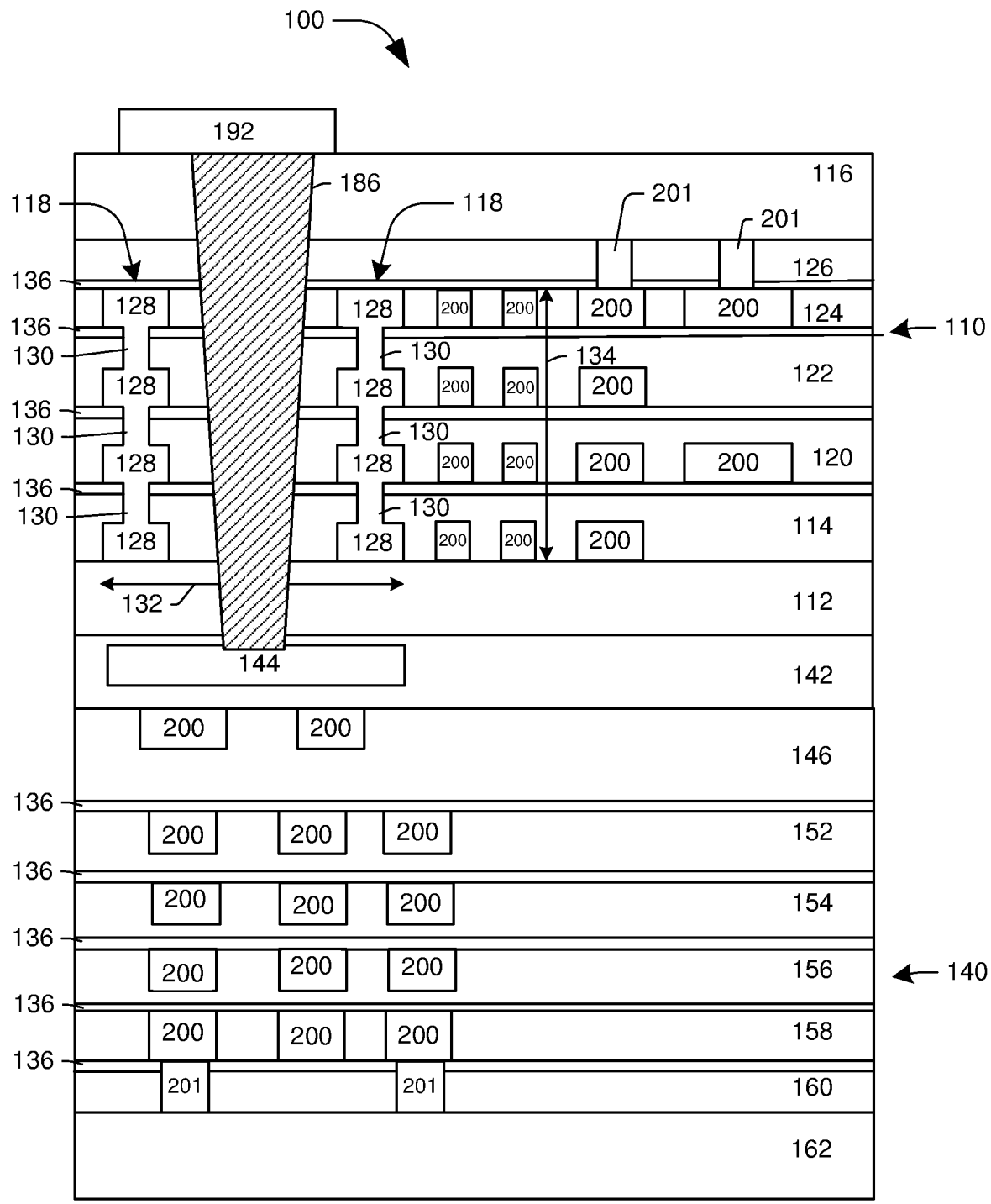

Referring to FIG. 8, the conductive layer 192 is patterned so that portions of the conductive layer 192 are removed from the top surface of the first substrate 116. In some embodiments, the portions of the conductive layer are removed such that the conductive layer 192 covers at least some of the vertical conductive structure 186. In some embodiments, the conductive layer 192 is patterned by at least one of lithography, etching, or other suitable techniques. According to some embodiments, the vertical conductive structure 186 connects the conductive layer 192 in or on the first portion 110 of the semiconductor arrangement 100 to the conductive layer 144 in the second portion 140 of the semiconductor arrangement 100 while being at least partially surrounded, encircled, etc. by the first guard ring 118.

Figure 9:
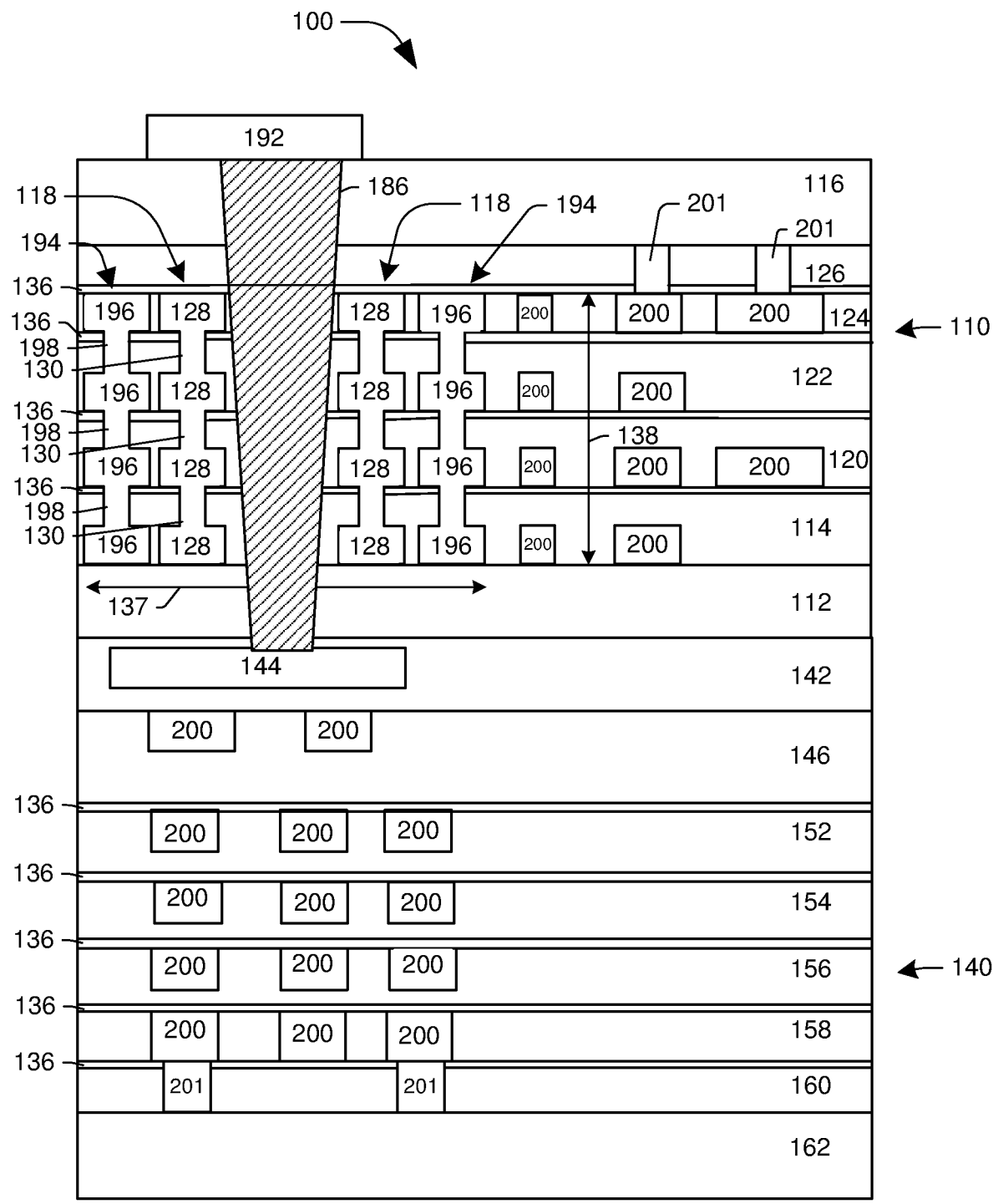

FIG. 9, illustrates the semiconductor arrangement 100 according to some embodiments. In some embodiments a second guard ring 194 is formed adjacent to, around, concentric to, etc. the first guard ring 118. In some embodiments, at least some of the second guard ring 194 is in contact with at least some of the first guard ring 118. In some embodiments, the second guard ring 194 is not in contact with the first guard ring 118.

According to some embodiments, the second guard ring 194 includes at least one of a metal layer 196 or a vertical interconnect access (VIA) 198. According to some embodiments, at least one of the metal layer 196 or the VIA 198 includes at least one of Al, Cu, Sn, Ni, Au, Ag, W, or other suitable materials. In some embodiments, at least one of the metal layer 196 or the VIA 198 does not include metal. In some embodiments, the second guard ring 194 has a same composition as the first guard ring 118. In some embodiments, the second guard ring 194 has a different composition than the first guard ring 118.

In some embodiments, at least one of the metal layer 196 or the VIA 198 is in at least one of the dielectric layers 114, 120, 122, or 124. According to some embodiments, the second guard ring 194 includes alternating layers of the metal layer 196 and the VIA 198. According to some embodiments, at least some of the metal layers 196 have a same width. In some embodiments, at least some of the metal layers 196 have different widths. In some embodiments, at least some of the metal layers 196 have a same height. In some embodiments, at least some of the metal layers 196 have different heights. In some embodiments, at least some of the VIAs 198 have a same width. In some embodiments, at least some of the VIAs 198 have different widths. In some embodiments, at least some of the VIAs 198 have a same height. In some embodiments, at least some of the VIAs 198 have different heights.

According to some embodiments, at least some of the metal layers 196 have a same width as at least one of at least some of the metal layers 128, at least some of the VIAs 130, or at least some of the VIAs 198. In some embodiments, at least some of the metal layers 196 have a different width than at least one of at least some of the metal layers 128, at least some of the VIAs 130, or at least some of the VIAs 198. In some embodiments, at least some of the metal layers 196 have a same height as at least one of at least some of the metal layers 128, at least some of the VIAs 130, or at least some of the VIAs 198. In some embodiments, at least some of the metal layers 196 have a different height than at least one of at least some of the metal layers 128, at least some of the VIAs 130, or at least some of the VIAs 198. In some embodiments, the second guard ring 194 has a width 137 of about 3 micrometers to about 7 micrometers. In some embodiments, the second guard ring 194 has a height 138 of about 0.5 micrometer to about 4 micrometers. In some embodiments, the width 137 of second guard ring 194 is the same as the width 132 of the first guard ring 118. In some embodiments, the width 137 of second guard ring 194 is different than the width 132 of the first guard ring 118. In some embodiments, the height 138 of second guard ring 194 is the same as the height 134 of the first guard ring 118. In some embodiments, the height 138 of second guard ring 194 is different than the height 134 of the first guard ring 118.

In some embodiments, at least one of the metal layer 196 or the VIA 198 is formed by at least one of lithography, etching, physical vapor deposition (PVD), sputtering, chemical vapor deposition (CVD), low pressure CVD (LPCVD), atomic layer chemical vapor deposition (AL-CVD), ultrahigh vacuum CVD (UHVCVD), reduced pressure CVD (RPCVD), molecular beam epitaxy (MBE), liquid phase epitaxy (LPE), or other suitable techniques. In some embodiments, at least some of the second guard ring 194 is formed in a same manner as at least some of the first guard ring 118. In some embodiments, at least some of the second guard ring 194 is formed in a different manner than at least some of the first guard ring 118.

In some embodiments, a metal layer 196 and a VIA 198 are formed in the first dielectric layer 114, then the second dielectric layer 120 is formed and a metal layer 196 and a VIA 198 are formed in the second dielectric layer 120, then the third dielectric layer 122 is formed and a metal layer 196 and a VIA 198 are formed in the third dielectric layer 122, then the fourth dielectric layer 124 is formed and a metal layer 196 and a VIA 198 are formed in the fourth dielectric layer 124. In some embodiments, such a process is repeated any number of times to form the second guard ring 194. In some embodiments, one or more dielectric layers do not include at least one of a metal layer 196 or a VIA 198. In some embodiments, the second guard ring 194 is discontinuous in that one or more intervening dielectric layers do not include at least one of a metal layer 196 or a VIA 198. In some embodiments, a dielectric layer includes some of the second guard ring 194 but none of the first guard ring 118. In some embodiments, a dielectric layer includes none of the second guard ring 194 but some of the first guard ring 118.

Figure 10:
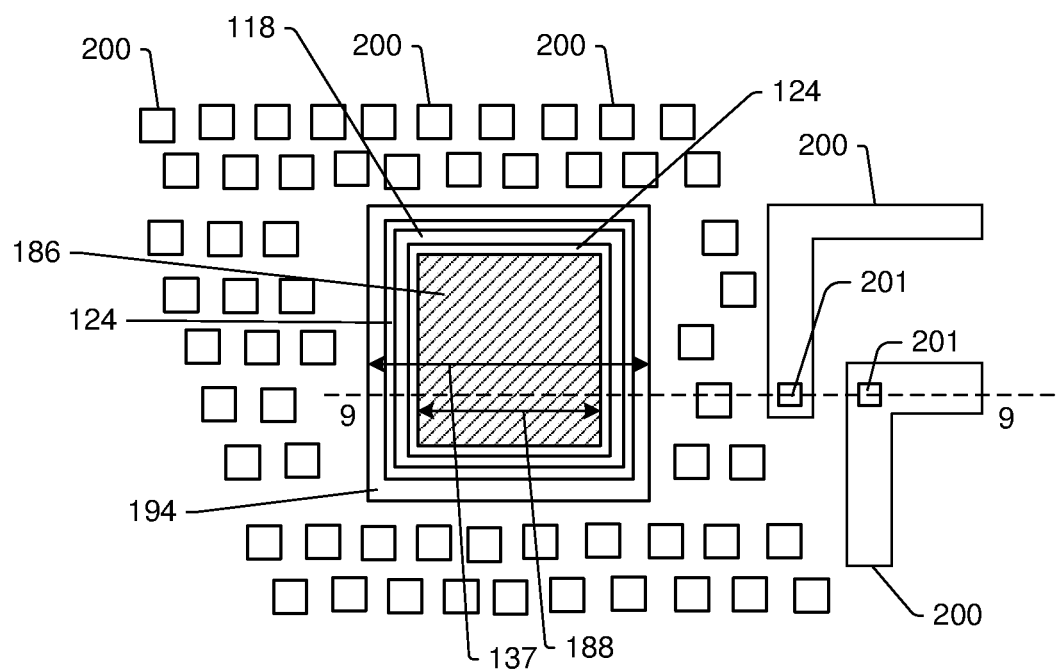
FIG. 10 illustrates a top-down view of a semiconductor arrangement during fabrication, in accordance with some embodiments.

FIG. 10 illustrates a top-down view of the semiconductor arrangement 100 of FIG. 9 when the conductive layer 192, the first substrate 116, the first ILD layer 126, and the etch stop layer 136 are removed, according to some embodiments. According to some embodiments, FIG. 9 corresponds to a cross sectional view taken along line 9-9 in FIG. 10. In some embodiments, the plurality of conductive elements 200 exist around the first guard ring 118 and the second guard ring 194. In some embodiments, at least some of the plurality of conductive elements 200 have a same composition as at least one of at least some of the metal layers 196 or at least some of the VIAs 198. In some embodiments, at least some of the plurality of conductive elements 200 have a different composition than at least one of at least some of the metal layers 196 or at least some of the VIAs 198.

In some embodiments, conductive elements 200 are used as wiring inside the semiconductor arrangement 100. According to some embodiments, the first guard ring 118 completely surrounds, encircles, etc. all sides or sidewalls of the vertical conductive structure 186. According to some embodiments, the first guard ring 118 is discontinuous or has a break so as to surround, encircle, etc. some but not all of the vertical conductive structure 186. According to some embodiments, the second guard ring 194 completely surrounds, encircles, etc. at least one of all sides or sidewalls of the vertical conductive structure 186 or all sides or sidewalls of the first guard ring 118. According to some embodiments, the second guard ring 194 is discontinuous or has a break so as to surround, encircle, etc. some but not all of at least one of the vertical conductive structure 186 or the first guard ring 118.

Although illustrated as generally quadrilateral, according to some embodiments a top profile of at least one of the vertical conductive structure 186, the first guard ring 118, or the second guard ring 194 is any desired shape other than quadrilateral, such as at least one of elliptical, polygonal, star shaped, etc.

Figure 11:
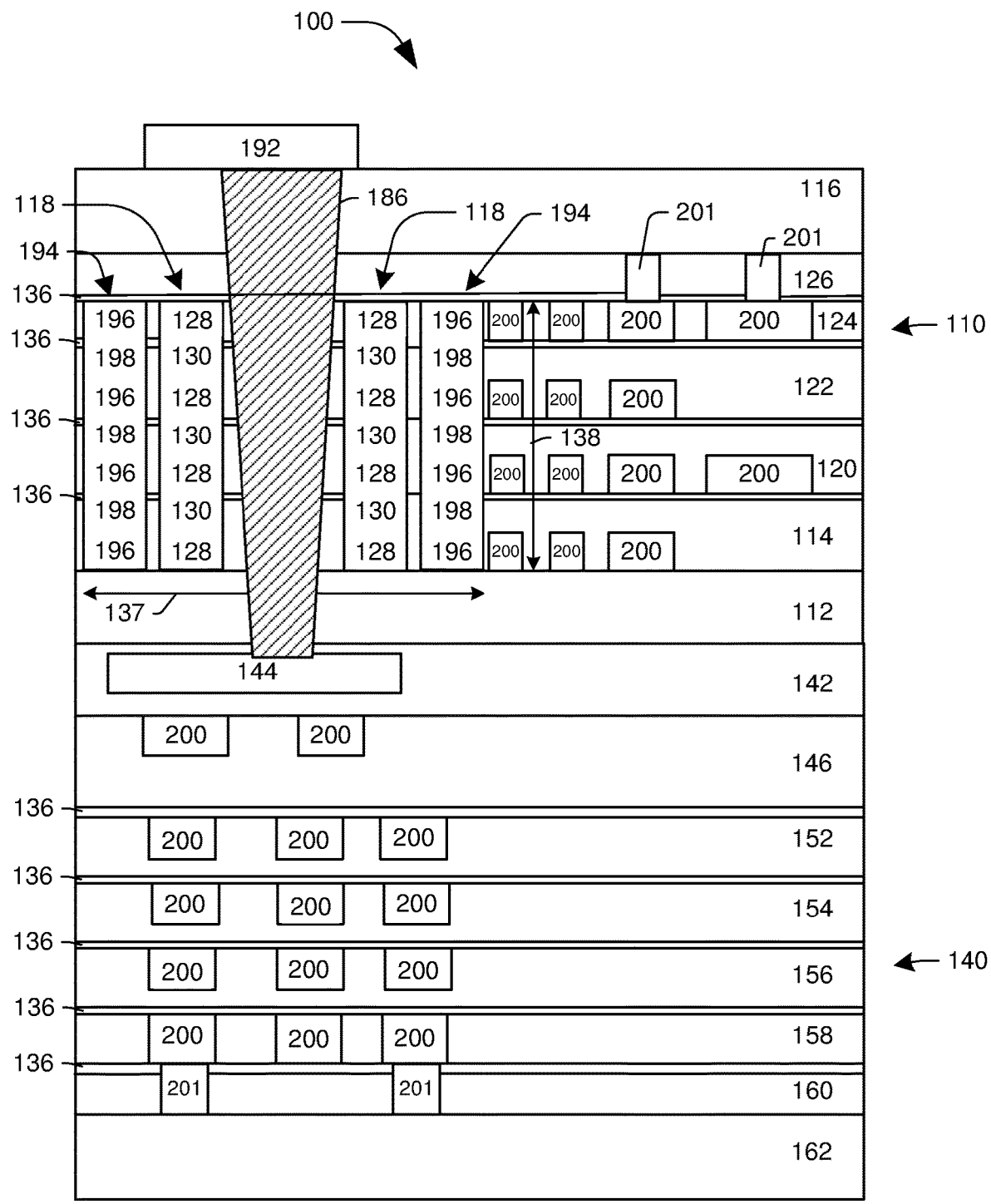
FIG. 11 illustrates a cross sectional view of a semiconductor arrangement during fabrication, in accordance with some embodiments.

FIG. 11 illustrates the semiconductor arrangement 100 where the metal layers 128, the VIAs 130, the metal layers 196, and the VIAs 198 have substantially uniform dimensions, such as widths and heights, according to some embodiments. In some embodiments, the first guard ring 118 is discontinuous in that one or more intervening dielectric layers do not include at least one of a metal layer 128 or a VIA 130. In some embodiments, the second guard ring 194 is discontinuous in that one or more intervening dielectric layers do not include at least one of a metal layer 196 or a VIA 198.

Figure 12:
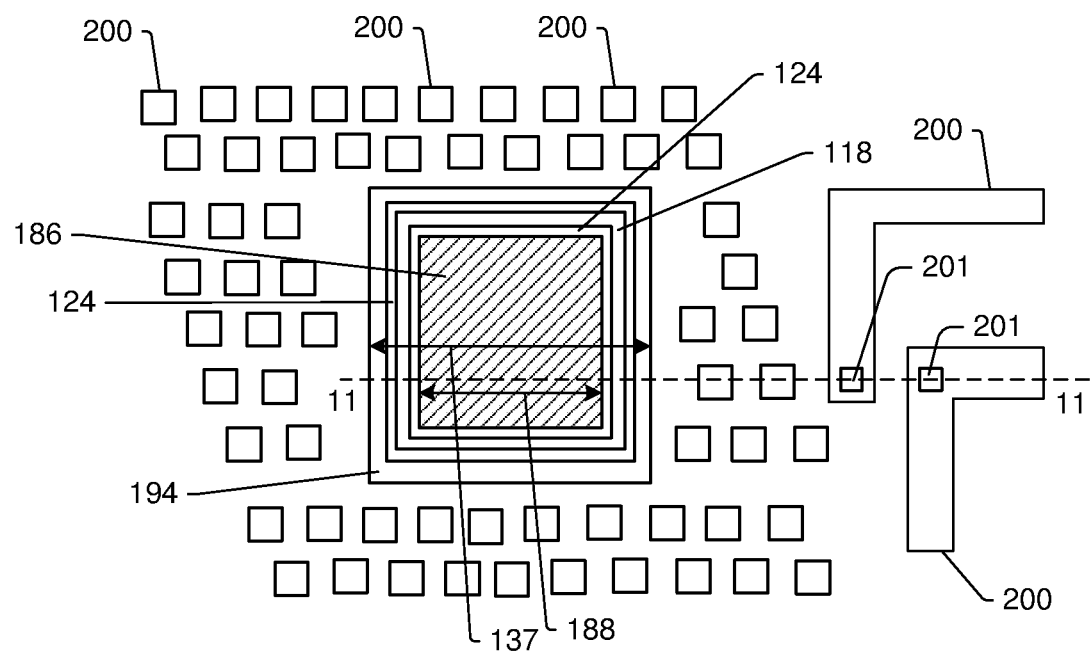
FIG. 12 illustrates a top-down view of a semiconductor arrangement during fabrication, in accordance with some embodiments.

FIG. 12 illustrates a top-down view of the semiconductor arrangement 100 of FIG. 11 when the conductive layer 192, the first substrate 116, the first ILD layer 126, and the etch stop layer 136 are removed, according to some embodiments. According to some embodiments, FIG. 11 corresponds to a cross sectional view taken along line 11-11 in FIG. 12. FIG. 12 mirrors FIG. 10 given that merely the uppermost metal layer 128 of the first guard ring 118 and the uppermost metal layer 196 of the second guard ring 194 are visible in FIG. 10 and in FIG. 12. According to some embodiments, the first guard ring 118 completely surrounds, encircles, etc. all sides or sidewalls of the vertical conductive structure 186. According to some embodiments, the first guard ring 118 is discontinuous or has a break so as to surround, encircle, etc. some but not all of the vertical conductive structure 186. According to some embodiments, the second guard ring 194 completely surrounds, encircles, etc. at least one of all sides or sidewalls of the vertical conductive structure 186 or all sides or sidewalls of the first guard ring 118. According to some embodiments, the second guard ring 194 is discontinuous or has a break so as to surround, encircle, etc. some but not all of at least one of the vertical conductive structure 186 or the first guard ring 118.

Although illustrated as generally quadrilateral, according to some embodiments a top profile of at least one of the vertical conductive structure 186, the first guard ring 118, or the second guard ring 194 is any desired shape other than quadrilateral, such as at least one of elliptical, polygonal, star shaped, etc.

According to some embodiments, the first portion 110 of the semiconductor arrangement 100 is associated with backside Illumination (BSI) contact image sensors (CIS). In some embodiments, image sensors are turned upside down and color filters and micro-lenses are applied to backsides of pixels for light collection. In some embodiments, such arrangements of elements increase an amount of light captured and thereby improve performance in low-light situations. In some embodiments, the second portion 140 of the semiconductor arrangement 100 is associated with an application specific integrated circuit (ASIC).

According to some embodiments, a semiconductor arrangement includes a first portion and a second portion under the first portion. The first portion includes a first passivation layer, a first dielectric layer over the first passivation layer, a first substrate over the first dielectric layer, a first conductive layer over the first substrate, and a first guard ring in the first dielectric layer. The second portion includes a second passivation layer, a second conductive layer in the second passivation layer, a second dielectric layer under the second passivation layer; and a second substrate under the second dielectric layer. The semiconductor arrangement includes a vertical conductive structure passing through the first substrate, the first dielectric layer, and the first passivation layer, wherein the vertical conductive structure contacts the first conductive layer and the second conductive layer and is surrounded by the first guard ring.

In some embodiments, the first passivation layer is in contact with the second passivation layer.

In some embodiments, the vertical conductive structure has a tapered sidewall.

In some embodiments, the first dielectric layer is an extra low-k dielectric.

In some embodiments, the first conductive layer covers portions of the first substrate.

In some embodiments, the first portion includes a second dielectric layer wherein the vertical conductive structure passes through the second dielectric layer and the first guard ring is in the second dielectric layer.

In some embodiments, the first portion includes a second guard ring in the first dielectric layer and surrounding the first guard ring.

In some embodiments, the first guard ring and the second guard ring are not connected to each other.

According to some embodiments, a semiconductor arrangement includes a first portion and a vertical conductive structure. The first portion includes a first dielectric layer and a first guard ring in the first dielectric layer, wherein the first guard ring comprises, in the first dielectric layer, a first metal layer coupled to a first via. The vertical conductive structure passes through the first dielectric layer and is proximate the first guard ring.

In some embodiments, the first portion includes a second dielectric layer wherein the vertical conductive structure passes through the second dielectric layer and the first guard ring is in the second dielectric layer.

In some embodiments, the first guard ring includes, in the second dielectric layer, a second metal layer coupled to a second via.

In some embodiments, the first portion includes a third dielectric layer between the first dielectric layer and the second dielectric layer, the vertical conductive structure passes through the third dielectric layer, and the first guard ring is not in the third dielectric layer.

In some embodiments, the first metal layer has a first width and the first via has a second width less than the first width.

In some embodiments, the first portion includes a second guard ring in the first dielectric layer and around the first guard ring.

In some embodiments, the first portion includes a second dielectric layer and a third dielectric layer, the third dielectric layer is between the first dielectric layer and the second dielectric layer, the vertical conductive structure passes through the second dielectric layer, the vertical conductive structure passes through the third dielectric layer, the first guard ring is in the second dielectric layer but not the third dielectric layer, and the second guard ring is in the third dielectric layer but not the second dielectric layer.

In some embodiments, the first dielectric layer is an extra low-k dielectric.

According to some embodiments, a method for forming a semiconductor arrangement, includes forming a first guard ring in a first dielectric layer and forming a vertical conductive structure having a tapered sidewall and that passes through the first dielectric layer and is surrounded by the first guard ring.

In some embodiments, the method includes forming a second guard ring in the first dielectric layer, wherein the second guard ring surrounds the first guard ring.

In some embodiments, the method includes forming the first guard ring in a second dielectric layer, wherein forming the vertical conductive structure includes forming the vertical conductive structure to pass through the second dielectric layer.

In some embodiments, forming the first guard ring includes forming a first metal layer in the first dielectric layer and forming a first via in the first dielectric layer and in contact with the first metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first portion comprising:
      a first passivation layer;
      a first dielectric layer over the first passivation layer;
      a first substrate over the first dielectric layer;
      a first conductive layer over the first substrate;
      a first guard ring in the first dielectric layer; and
      a second guard ring in the first dielectric layer and surrounding the first guard ring, wherein the first guard ring and the second guard ring are not connected to each other;
   a second portion under the first portion, the second portion comprising:
      a second passivation layer;
      a second conductive layer in the second passivation layer;
      a second dielectric layer under the second passivation layer; and
      a second substrate under the second dielectric layer; and
   a vertical conductive structure passing through the first substrate, the first dielectric layer, and the first passivation layer, wherein the vertical conductive structure contacts the first conductive layer and the second conductive layer and is surrounded by the first guard ring.

2. The semiconductor arrangement of claim 1, wherein the first passivation layer is in contact with the second passivation layer.

3. The semiconductor arrangement of claim 1, wherein the vertical conductive structure has a tapered sidewall.

4. The semiconductor arrangement of claim 1, wherein the first dielectric layer comprises an extra low-k dielectric.

5. The semiconductor arrangement of claim 1, wherein the first conductive layer covers portions of the first substrate.

6. The semiconductor arrangement of claim 1, wherein:
   the first portion comprises a third dielectric layer;
   the vertical conductive structure passes through the third dielectric layer; and
   the first guard ring is in the third dielectric layer.

7. A semiconductor arrangement, comprising:
   a first portion, comprising:
      a first dielectric layer;
      a first guard ring in the first dielectric layer, wherein the first guard ring comprises, in the first dielectric layer, a first metal layer coupled to a first via;
      a second dielectric layer, wherein the first guard ring is in the second dielectric layer; and
      a third dielectric layer between the first dielectric layer and the second dielectric layer, wherein the first guard ring is not in the third dielectric layer; and
   a vertical conductive structure passing through the first dielectric layer, the second dielectric layer, and the third dielectric layer and proximate the first guard ring.

8. The semiconductor arrangement of claim 7, wherein the first guard ring comprises, in the second dielectric layer, a second metal layer coupled to a second via.

9. The semiconductor arrangement of claim 7, wherein the first metal layer has a first width and the first via has a second width less than the first width.

10. The semiconductor arrangement of claim 7, wherein the first portion further comprises a second guard ring in the first dielectric layer and around the first guard ring.

11. The semiconductor arrangement of claim 10, wherein the second guard ring is in the third dielectric layer but not the second dielectric layer.

12. The semiconductor arrangement of claim 10, wherein the vertical conductive structure is surrounded by the first guard ring on at least two sides.

13. The semiconductor arrangement of claim 10, wherein the first guard ring and the second guard ring are not connected to each other.

14. The semiconductor arrangement of claim 7, wherein the first dielectric layer comprises an extra low-k dielectric.

15. A semiconductor arrangement, comprising:
   a first portion, comprising:
      a first dielectric layer;

a first guard ring in the first dielectric layer, wherein the first guard ring comprises, in the first dielectric layer, a first metal layer coupled to a first via; and a second guard ring in the first dielectric layer and around the first guard ring; and a vertical conductive structure passing through the first dielectric layer and proximate the first guard ring.

16. The semiconductor arrangement of claim 15, wherein:

the first portion comprises a second dielectric layer and a third dielectric layer;

the third dielectric layer is between the first dielectric layer and the second dielectric layer;

the vertical conductive structure passes through the second dielectric layer and the third dielectric layer; and the second guard ring is in the third dielectric layer but not the second dielectric layer.

17. The semiconductor arrangement of claim 16, wherein the first guard ring is in the second dielectric layer but not the third dielectric layer.

18. The semiconductor arrangement of claim 15, wherein the first guard ring and the second guard ring are not connected to each other.

19. The semiconductor arrangement of claim 15, wherein the first guard ring is spaced apart from the vertical conductive structure by a portion of the first dielectric layer.

20. The semiconductor arrangement of claim 15, comprising:

a conductive layer, wherein the first guard ring is in contact with the conductive layer.

* * * * *